US006500604B1

(12) United States Patent
Dimitrakopoulos et al.

(10) Patent No.: US 6,500,604 B1
(45) Date of Patent: Dec. 31, 2002

(54) METHOD FOR PATTERNING SENSITIVE ORGANIC THIN FILMS

(75) Inventors: Christos Dimitrios Dimitrakopoulos, West Harrison, NY (US); Ioannis Kymissis, New Hyde Park, NY (US); Sampath Purushothaman, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/476,275

(22) Filed: Jan. 3, 2000

(51) Int. Cl.[7] .................................................. G03C 5/58
(52) U.S. Cl. ....................... 430/322; 430/323; 430/961; 438/455; 438/629
(58) Field of Search ................................ 430/322, 323, 430/961; 438/455, 629

(56) References Cited

U.S. PATENT DOCUMENTS

| 4,946,549 | * | 8/1990 | Bachman et al. ............ 156/643 |
| 5,412,002 | * | 5/1995 | Enomoto et al. ............ 523/466 |
| 5,796,121 | * | 8/1998 | Gates ........................... 257/59 |
| 5,861,219 | * | 1/1999 | Thompson et al. .......... 313/504 |
| 6,174,800 | * | 1/2001 | Jang ............................. 438/629 |
| 6,197,663 | * | 3/2001 | Chandross et al. ......... 438/455 |

OTHER PUBLICATIONS

M. Roussy, et al. "Forming a Passive Matrix Addressed OLED with a Lift–Off Photoresist", Abstracts of the Materials Research Society, 1998 Fall Meeting, p. 374.

* cited by examiner

Primary Examiner—Mark F. Huff
Assistant Examiner—Daborah Chacko-Davis
(74) Attorney, Agent, or Firm—Scully, Scott, Murphy & Presser; Daniel P. Morris, Esq.

(57) ABSTRACT

A method for patterning a chemically sensitive organic thin film such as pentacene comprising (a) forming a protective material layer on the surface of a chemically sensitive organic thin film, said protective material layer being chemically resistant; (b) forming a photoresist on an exposed surface of said protective material layer; (c) patterning the photoresist; and (d) transferring the pattern to the protective material layer and the chemically sensitive organic thin film by dry etching.

24 Claims, 1 Drawing Sheet

METHOD FOR PATTERNING SENSITIVE ORGANIC THIN FILMS

DESCRIPTION

1. Field of the Invention

The present invention relates to a method for patterning organic thin films that are difficult to pattern using conventional means such as lithography and etching.

2. Background of the Invention

Organic thin films such as pentacene, hexathiophene and polythiophene have been used in various applications, and continued research on such material is presently ongoing. Organic thin films are typically used in electronic devices, such as organic thin film transistors (OTFTs) and organic light emitting diodes (OLEDs). Unfortunately, many organic materials which have useful electronic properties are intolerant of solvent exposure after deposition, and therefore cannot be patterned using ordinary lithographic processes.

Researchers in this field thus normally either use unpatterned films or use a shadow mask during deposition to pattern the organic material. Recently, M. Roussy, et al. have developed an isolation technique which employs topographic discontinuities to isolate the devices (see, M. Roussy, et al. "Forming a Passive matrix Addressed OLED with a Lift-Off Photoresist", Abstracts of the Materials Research Society, 1998 Fall Meeting, p. 374). In this technique, the photoresist is laid down, exposed and caused to swell; the swelling creates gaps in the surface topography. A material is then vapor deposited at an appropriate angle to prevent bridging of the gaps thus formed thereby effectively isolating the devices. This technique developed by M. Roussy, et al. requires that the semiconductor material and the photoresist remain in inactive areas. This restriction can be a severe limitation for many applications. A subtractive technique for isolating devices has not been found in the prior art.

There are several disadvantages to using unpatterned films and topographic techniques to isolate the active areas in OFETs and OLEDs. The disadvantages include:

(i) In OFET and OLED applications, it is often desirable that inactive areas are optically clear; this can only be achieved by removing the material from the inactive areas.

(ii) In OFET and OLED applications, deposition of additional active layers (such as additional material to vary OLED emission color, or OLEDs onto an OFET controlled device) may be desired. This will require removal of inactive material and a flat topography.

(iii) Topography isolation techniques may only be used when the organic thin film material is deposited by a strongly directional process, such as vacuum deposition.

Sputtered or spun-on organic thin films will not be patterned.

(iv) Using unpatterned organic material in OFET applications permits fringe current flow through an ungated area, which leads to a decrease in the on/off ratio, a significant figure of merit, which in unpatterned devices adversely affects the contrast ratio in analog applications and the noise margin in digital applications.

The use of shadow masks, on the other hand, provides patterning of the material without some of these disadvantages. There are however several limitations associated with using shadow masks. These limitations include:

(i) The minimum feature size definable by a shadow mask is much larger than that which can be lithographically processed.

(ii) Shadow masks may only be used in vapor deposited processes, such as molecular beam deposition; spun-on material cannot be patterned in this way.

(iii) Use of a shadow mask requires contact with the substrate; this can introduce scratches and other undesirable defects to the electronic device.

(iv) The edge of devices created using shadow masks are susceptible to adhesion to the mask; creating poorly defined edges.

(v) Thin and fragile masks must be used due to the small dimensions involved; such masks often develop defects and break quickly.

(vi) Shadow masks must be cleaned; this is time consuming and often damages the mask.

(vii) Because the mask is so thin, large areas cannot be covered with a shadow mask.

It is also possible in the prior art to pattern organic thin films using a photoresist. In such techniques, the photoresist is applied directly to the surface of an organic thin film and then patterned using lithography and etching. A major drawback of this technique is that the photoresist and the solvent it contains as well as the etchants used come into direct contact with the organic thin film. Such direct contact can cause damage or alter the structure and properties of some organic films.

In view of the numerous drawbacks with the above mentioned prior art processes, there remains a need for developing a method in which organic thin films can be patterned without damaging the surface of the organic thin film.

SUMMARY OF THE INVENTION

One object of the present invention is to provide a subtractive etch patterning method for patterning organic thin films which are difficult to etch using conventional lithography and etching processes and do not tolerate contact with solvents and other chemicals without resulting in damage to the organic thin film or alteration of its structure and properties.

Another object of the present invention is to provide a method for isolating active areas of organic thin films not tolerant of solvent or other chemical exposure.

A yet other object of the present invention is to provide a method which uses substantially subtractive means to perform the isolation, leaving other areas free of material.

Other objects of the present invention include:

To provide an isolation method which operates independently of the method of deposition of the organic thin film.

To provide an isolation method which operates independently of the chemical resistance of the organic thin film material and the composition of the photoresist used.

To provide an isolation method which requires no contact with the substrate or the use of a fragile component.

These and other objects and advantages can be obtained in the present invention by utilizing a method wherein a protective material layer is employed and is used to protect an underlying chemically sensitive organic thin film. It is noted that the term "thin", when used in conjunction with the chemically sensitive organic thin film, denotes a thickness about 10,000 Å or less. The term "chemically sensitive"

denotes a material that is highly responsive, i.e., susceptible, to solvent, etchant or other chemical exposure such that upon contact with the chemical it may be damaged, while the term "chemically resistant" denotes a material that is not susceptible to damage or alteration of properties and structure by exposure to most chemicals and especially the ones used in the patterning process. However, it should be etchable with reactive-ion etching (RIE) or any other dry etching processes.

Specifically, the method of the present invention comprises the steps of:

(a) forming a protective material layer on the surface of a chemically sensitive organic thin film, said protective material layer being chemically resistant;

(b) forming a photoresist on an exposed surface of said protective material layer;

(c) patterning the photoresist; and (d) transferring the pattern to the protective material layer and the chemically sensitive organic thin film by dry etching.

The method of the present invention can be used in conjunction with typical processing steps that are used in fabricating OTFTs and OLEDs.

DETAILED DESCRIPTION OF THE INVENTION

Figure 1A:
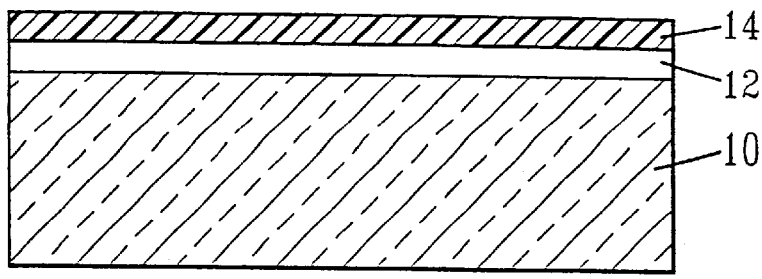
FIGS. 1a–d are cross-sectional views of various structures during the different processing steps of the present invention.
Figure 1B:
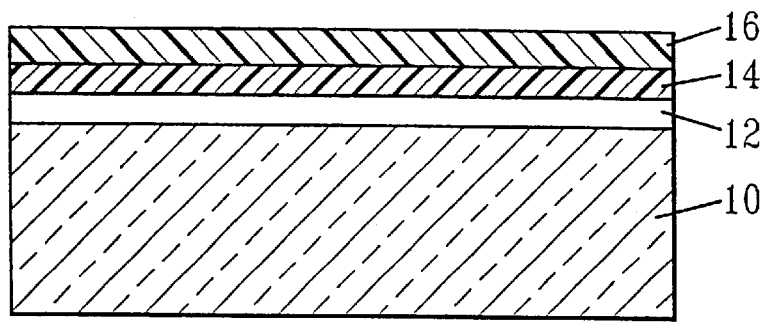

The present invention which provides a method of patterning chemically sensitive organic thin films will now be described in more detail by referring to the drawings that accompany the present application. It is noted that in the accompanying drawings like reference numerals are used for describing like and corresponding elements of the present invention.

Reference is first made to FIG. 1a which illustrates the first step of the inventive method. Specifically, FIG. 1a shows a structure which comprises a substrate 10, a chemically sensitive organic thin film 12 formed on a surface of substrate 10, and a chemically resistant, protective material layer 14 formed on an exposed surface of the organic thin film.

Suitable substrates that can be employed in the present invention include, but are not limited to: Si-containing substrates such as $SiO_2$, Si, SiGe, silicon nitride, silicon-on-insulators and glass. The substrate of the present invention may also comprise other inorganic materials such as sapphire, interconnect structures, metal layers and diamond-like carbon (DLC) as well as organic materials that are not chemically sensitive such as polyethylene terphthalate (PET) and polyimide. The substrate may also be a circuit board or laminate. A highly preferred substrate employed in the present invention is a Si-containing substrate; with $SiO_2$ being most preferred.

The substrate may contain various active device regions and/or isolation regions either on the surface thereof or in the substrate itself. For example, the substrate may contain source/drain regions, shallow trench isolation regions, field oxide regions, a gate region, source/drain electrodes, a gate insulator, a self-assembled monolayer on said electrodes, metallization layers, dielectric layers and other like layers that are typically present on the surface of a substrate during device manufacturing.

A preferred substrate employed in the present invention comprises $SiO_2$ having a patterned gate region on a surface thereof. The patterned gate region is isolated from other devices by a surrounding gate insulator. The exposed surface of the gate insulator contains source/drain electrodes which have a self-assembled monolayer thereon. While the drawings of the present invention do not show these regions, they are nevertheless meant to be included in region 10.

AS shown in FIG. 1a, a chemically sensitive organic thin film 12 is formed on an exposed surface of substrate 10. The chemically sensitive organic thin film is formed on the substrate utilizing conventional deposition processes well known to those skilled in the art. For example, the chemically sensitive organic thin film can be formed by molecular beam deposition, vapor deposition, vaccum sublimation, chemical vapor deposition, plasma-assisted chemical vapor deposition, reactive deposition, sputtering, spin-on coating, dip coating and other like deposition processes. The thickness of the deposited organic thin film is about 10,000 Å or less, with a thickness of from about 100 to about 1000 Å being highly preferred.

Suitable materials that can be employed in the present invention in forming the organic thin film, include, but are not limited to: pentacene, hexathiopene, polythiopene, phthalocyanines, polythienylene vinylene, polyphenylene vinylene (PPV), tris-(8-hydroxyquinoline) aluminum and other like organic materials that are highly sensitive to solvents, etchants and other chemicals. Of these materials, pentacene is a highly preferred organic thin film material since it shows high charge carrier mobility.

In one embodiment of the present invention (not shown in the drawings), one or more material layers that are compatible with the organic thin film may be formed on the surface thereof prior to forming the protective material layer on the structure. For example, metallization layers or dielectric layers may be formed on the surface of the organic thin film material shown in FIG. 1a prior to deposition of the protective material layer.

Next, the protective material layer is formed on an exposed surface of the organic thin film. Any suitable protective material which is capable of acting as a barrier layer and is chemically resistant can be used in the present invention. Illustrative protective materials that can be employed include, but are not limited to: Parylene-N, Parylene-C and other like parylenes. Of these protective materials, Parylene-N is highly preferred in the present invention.

Protective material layer 14 is formed on the surface of the organic thin film using conventional deposition processes including those mentioned hereinabove in forming the organic thin film. The thickness of the protective material layer is not critical to the present invention as long as the protective material is sufficiently thick so as prevent any external material (gas, solid or liquid) from coming into contact with the underlying organic thin film. Typically, the thickness of the protective material layer is from about 0.5 to about 10 microns, with from about 1 to about 2 microns being highly preferred.

In accordance with the next step of the present invention, a photoresist 16 is formed on an exposed area of the protective material layer. Any conventional photoresist (positive tone or negative tone) which is well known to those skilled in the art may be employed in the present invention. The photoresist is formed using conventional deposition processes such as chemical vapor deposition, dip coating or spin-on coating. The thickness of the photoresist is not critical to the present invention, but typically a thickness of from about 1 to about 2 microns is employed herein.

The photoresist may then be optionally cured by heating the same at a temperature of about 85° C. for a time period of from about 30 minutes and/or at a temperature of about 100° C. for about 5 minutes. Other curing temperatures and times are also contemplated in the present invention and will vary depending on the type of photoresist employed.

The photoresist (cured or uncured) is then patterned using standard lithography techniques and the pattern is then developed using a standard developer. A mask or maskless process may be used to pattern the photoresist. Notwithstanding which process is employed, the photoresist is exposed to a suitable light energy source, such as UV radiation, at an energy of from about 10 to about 200 milijoules. More preferably, the photoresist is exposed to UV radiation having a wavelength of 400 nm at an energy of from about 70 milijoules.

Figure 1C:
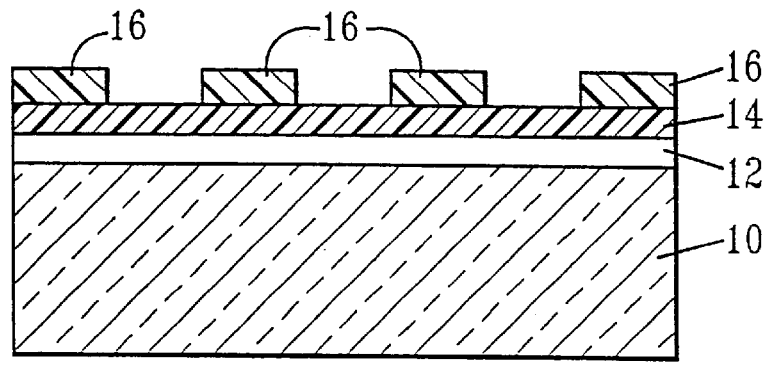

The pattern is then developed using a conventional developer which is highly selective in removing either exposed or unexposed regions of the photoresist. An example of a typical developer that may be used in the present invention is Microposit developer CD-30®. However, other developers can be used in conjunction with the large number of available photoresist systems. The structure formed after pattern development is shown in FIG. 1c.

After development, the patterned photoresist is dried at 85° C. for about 5 minutes and may be optionally subjected to a post-development curing step. The optional post-development cure is carried out by heating the developed photoresist at a temperature of from about 95° to about 110° C. for a time period of from about 30 to about 40 minutes. Other curing temperatures and times are also contemplated in the present invention and will vary depending on the type of photoresist employed.

Figure 1D:
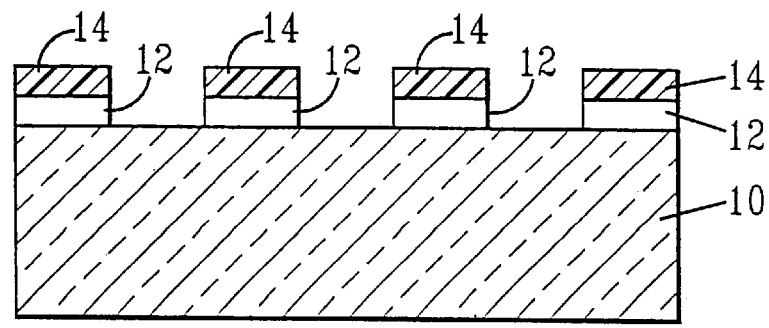

The next step of the pattering step is shown in FIG. 1d. Specifically, as shown in that figure, the pattern is transferred to the protective material and the organic thin film utilizing any conventional dry etch process. Specifically, reactive-ion etching, plasma etching or e-beam etching may be employed in transferring the pattern from the photoresist to the other two underlying layers. A preferred dry etching process that can be employed in the present invention is oxygen plasma etching. Typical conditions include: an oxygen pressure of from about 10 to about 500 militorr, with 100 militorr being highly preferred, and an RF power of from about 100 to about 200 watts, with 150 watts being highly preferred. An etch duration of about 30 minutes is typically employed. Other oxygen plasma operating conditions can also be employed in the present invention.

After patterning the underlying protective material layer and the chemically sensitive organic thin film, the photoresist may optionally be removed using conventional stripping processes well known to those skilled in the art. The structure shown in FIG. 1d may then be subjected to further processing steps which are typically employed in fabricating OTFTs and OLEDs.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the appended claims.

What is claimed is:

1. A method of patterning a chemically sensitive organic thin film comprising the steps of:

(a) forming a protective material layer on a surface of a chemically sensitive organic film selected from the group consisting of pentacene, hexathiopene, polythiopene, polythienylene vinylene, polyphenylene vinylene, tris-(8-hydroxyquinoline) aluminum, and phthalocyanines, said protective material layer is a parylene which is chemically resistant;

(b) forming a photoresist on an exposed surface of said protective material layer;

(c) patterning the photoresist; and (d) transferring the pattern to the protective material layer and the chemically sensitive organic thin film by dry etching.

2. The method of claim 1 wherein said chemically sensitive organic thin film is formed on a Si-containing substrate, an organic substrate or an inorganic substrate.

3. The method of claim 2 wherein said substrate comprises $SiO_2$.

4. The method of claim 3 wherein said $SiO_2$ substrate comprises a patterned gate region formed on a surface thereof, said patterned gate region being isolated by a surrounding gate insulator, said gate insulator having source/drain electrodes.

5. The method of claim 4 wherein source/drain electrodes contain a self-assembled monolayer formed thereon.

6. The method of claim 1 wherein said organic thin film is formed by a deposition process selected from the group consisting of molecular beam deposition, vapor deposition, vacuum sublimation, chemical vapor deposition, plasma-assisted chemical vapor deposition, reactive deposition, spin-on coating, and dip coating.

7. The method of claim 1 wherein said organic thin film has a thickness of about 10,000 Å or less.

8. The method of claim 7 wherein said organic thin film has a thickness of from about 100 to about 1000 Å.

9. The method of claim 1 wherein said chemically sensitive organic thin film is pentacene.

10. The method of claim 1 wherein said protective material layer comprises Parylene-N, or Parylene-C.

11. The method of claim 10 wherein said protective material layer comprises Parylene-N.

12. The method of claim 1 wherein said protective material layer is formed by a deposition process selected from the group consisting of vapor deposition, vacuum sublimation, chemical vapor deposition, plasma-assisted chemical vapor deposition, reactive deposition, spin-on coating, and dip coating.

13. The method of claim 1 wherein said protective material layer has a thickness of from about 0.5 to about 10 microns.

14. The method of claim 13 wherein said protective material layer has a thickness of from about 1 to about 2 microns.

15. The method of claim 1 wherein said photoresist is a positive tone material.

16. The method of claim 1 wherein step (c) includes exposure and development.

17. The method of claim 16 wherein said exposure comprises utilizing UV radiation at an energy of from about 10 to about 200 milijoules.

18. The method of claim 16 wherein said photoresist is cured prior to said exposure.

19. The method of claim 18 wherein said curing is carried out at a temperature of about 85° C. for a time period of about 30 minutes or at 100° C. for a time period of about 5 minutes.

20. The method of claim 16 wherein after development of the pattern a post-development curing step is employed.

21. The method of claim 10 wherein said post-development curing step is carried out at a temperature of from about 95° to about 110° C. for a time period of from about 30 to about 40 minutes.

22. The method of claim 1 wherein said dry etching comprises reactive-ion etching, plasma-etching or e-beam etching.

23. The method of claim 22 wherein said dry etching is a plasma etch process wherein oxygen plasma is employed.

24. The method of claim 1 wherein said photoresist is removed after conducting step (d).

* * * * *

UNITED STATES PATENT AND TRADEMARK OFFICE
CERTIFICATE OF CORRECTION

PATENT NO. : 6,500,604 B1
DATED : December 31, 2002
INVENTOR(S) : C. D. Dimitrakopoulos et al.

It is certified that error appears in the above-identified patent and that said Letters Patent is hereby corrected as shown below:

Column 4,
Line 9, "AS" should read -- As --

Column 7,
Line 7, "claim 10" should read -- claim 20 --

Signed and Sealed this

Twenty-second Day of July, 2003

JAMES E. ROGAN
*Director of the United States Patent and Trademark Office*